(12) United States Patent
Liu et al.

(10) Patent No.: US 7,746,698 B2
(45) Date of Patent: Jun. 29, 2010

(54) PROGRAMMING IN MEMORY DEVICES USING SOURCE BITLINE VOLTAGE BIAS

(75) Inventors: Zhizheng Liu, San Jose, CA (US); An Chen, Sunnyvale, CA (US); Wei Zheng, Santa Clara, CA (US); Kuo-Tung Chang, Saratoga, CA (US); Sung-Yong Chung, Santa Clara, CA (US); Gulzar Ahmed Kathawala, Santa Clara, CA (US); Ashot Melik-Martirosian, Sunnyvale, CA (US)

(73) Assignee: Spansion LLC, Sunnyvale, CA (US)

( * ) Notice: Subject to any disclaimer, the term of this patent is extended or adjusted under 35 U.S.C. 154(b) by 259 days.

(21) Appl. No.: 11/956,032

(22) Filed: Dec. 13, 2007

(65) Prior Publication Data

US 2009/0154246 A1    Jun. 18, 2009

(51) Int. Cl.
  *G11C 16/04* (2006.01)
(52) U.S. Cl. .............................. 365/185.18; 365/185.15; 365/185.28
(58) Field of Classification Search ............ 365/185.18, 365/185.22, 185.24, 185.33, 185.15, 185.28
See application file for complete search history.

(56) References Cited

U.S. PATENT DOCUMENTS

| 6,882,567 | B1 * | 4/2005 | Wong | 365/185.03 |
| 2008/0266964 | A1 * | 10/2008 | Sekar et al. | 365/185.17 |
| 2008/0298124 | A1 * | 12/2008 | Wong | 365/185.03 |

* cited by examiner

*Primary Examiner*—Gene N. Auduong
(74) *Attorney, Agent, or Firm*—Turocy & Watson, LLP

(57) ABSTRACT

Systems and methods that facilitate improved programming memory cells in a nonvolatile memory (e.g., flash memory) are presented. An optimized voltage component can facilitate supplying respective voltages to a source, drain, and gate associated with a memory cell during operations, such as programming operations. The optimized voltage component can facilitate supplying a predetermined source bitline voltage to a memory cell during programming of the cell to facilitate reducing leakage currents associated with the bitlines, which can improve programming of the memory cell, and to facilitate reducing the programming current, which can result in power efficient programming and improved programming speed.

20 Claims, 8 Drawing Sheets

PROGRAMMING IN MEMORY DEVICES USING SOURCE BITLINE VOLTAGE BIAS

TECHNICAL FIELD

The subject innovation relates to systems, methods and an apparatus that can facilitate performance of operations associated with a memory. In particular, the subject innovation can facilitate reducing leakage currents associated with operations in a memory to facilitate improved operations associated with the memory.

BACKGROUND

The volume, use, and complexity of computers and electronic devices are continually increasing. Computers consistently become more powerful and new and improved electronic devices are continually being developed (e.g., digital audio players, video players). Additionally, the growth and use of digital media (e.g., digital audio, video, images, and the like) have further pushed development of these devices. Such growth and development has vastly increased the amount of information desired/required to be stored and maintained for computer and electronic devices.

The use of portable computer and electronic devices has greatly increased demand for memory devices. Digital cameras, digital audio players, personal digital assistants, and the like generally seek to employ large capacity memory devices (e.g., flash memory, smart media, compact flash, . . . ). The increased demand for information storage is commensurate with memory devices having an ever-increasing storage capacity (e.g., increase storage per die or chip). A postage-stamp-sized piece of silicon may, for example, contain tens of millions of transistors, each transistor as small as a few hundred nanometers. The memory cells are typically arranged in an array.

A memory cell can be placed at each intersecting row and column in the array. Typically, a particular memory cell can be accessed by activating its row and then reading or writing the state of its column. Memory sizes are defined by the row and column architecture. For example, a 1024 row by 1024 column memory array can define a memory device having one megabit of memory cells, for example. The array rows can be referred to as wordlines and the array columns can be referred to as bitlines.

In memory cells, one or more bits of data can be stored in and read from respective memory cells. The memory cells can be programmed by various techniques, such as channel hot electron injection (CHEI), and can be erased by various techniques, such as Fowler-Nordheim tunneling. The erase, program, and read operations are commonly performed by application of appropriate voltages to certain terminals of the memory cell. For instance, in an erase or write operation the voltages are applied so as to cause a charge to be removed or stored in a charge storage layer of the memory cell.

The trend in semiconductor memory devices is toward higher circuit density with higher numbers of bit cells per device, lower operating voltages, and higher access speeds. To achieve these higher densities there have been, and continue to be, efforts toward scaling down device dimensions (e.g., at sub-micron levels). However, as the desired scaling down of device dimensions occur, leakage current effects can be increasingly problematic. For example, the channel lengths associated with memory cells can become increasingly shorter as memory devices are scaled down. However, with shorter channel lengths, the employ of CHEI during programming can result in increased undesirable leakage currents associated with the bitlines in the memory array, which can negatively affect programming and overall performance of the memory device. It is desirable to improve the performance of memory devices, including programming of memory devices, by reducing leakage currents associated with programming.

SUMMARY

The following presents a simplified summary of the innovation in order to provide a basic understanding of some aspects of the innovation. This summary is not an extensive overview of the innovation. It is intended to neither identify key or critical elements of the innovation nor delineate the scope of the innovation. Its sole purpose is to present some concepts of the innovation in a simplified form as a prelude to the more detailed description that is presented later.

Systems and methods that can facilitate improved performance of operations (e.g., programming) associated with memory components/devices (e.g., flash memory) are presented. In one aspect, a memory component can comprise a plurality of memory cells that can be contained in a memory array. The memory array can comprise a plurality of wordlines (WLs) and a plurality of bitlines (BLs) that cross the WLs to form the array. Memory cells can be formed at or near the points where the respective WLs and BLs cross each other. In accordance with one embodiment, the memory cells can be non-floating gate type memory cells. In accordance with another embodiment, the memory cells can be floating gate type memory cells.

In accordance with another aspect, to facilitate improving performing operations (e.g., programming) of the memory cells, the memory component can include an optimized voltage component that can apply respective predetermined voltages to BLs and WLs associated with the memory cells, which can thereby reduce undesirable BL leakage currents during programming of a memory cell(s). During programming, channel hot electron injection (CHEI) can be employed to facilitate programming of the memory cells. As memory devices are scaled down, channel lengths of the memory cells can be reduced, and as a result, there can be undesirable leakage currents associated with BLs during CHEI programming, which can negatively impact programming and overall memory performance. Conventionally, during CHEI programming of a selected memory cell (e.g., non-floating gate multi-bit flash memory cell), the voltage at the source BL associated with the memory cell is set at 0 volts, while the voltage at the drain BL associated with the memory cell can be set at approximately 4.0 volts. The selected memory cell can also have a WL voltage applied. The potential difference between the respective BLs for all non-selected memory cells (e.g., memory cells with no WL voltage applied) can result in BL leakage currents, which can negatively impact programming, for example, by decreasing programming speed, increasing the amount of power utilized to program, etc.

In accordance with an aspect, during programming (e.g., CHEI), the optimized voltage component can facilitate applying respective predetermined voltages to the BLs associated with the memory cell(s) being programmed, which can facilitate reducing the leakage currents such that the programming current can be significantly higher than the leakage currents, and yet the programming current also can be at a lower level for programming, as compared to memory devices programmed using conventional CHEI. In one aspect, during programming, the optimized voltage component can facilitate providing a predetermined source voltage (e.g., $V_s$) to a BL associated with the terminal on a source side of the selected memory cell, where the predetermined source voltage can be at a positive bias (e.g., greater than or equal to 0.5 volts), for example. The optimized voltage component also can provide a predetermined drain voltage (e.g., $V_d$) to a BL associated with a terminal on the drain side of the memory cell. The optimized voltage component can provide a predetermined WL voltage to the gate terminal of the selected memory cell. As a result of applying a positive voltage bias to the source BL associated with the memory cell, a forward program current (e.g., $V_{ds}$) can be created across the memory cell, which can result in the program current being lower than the program current associated with conventional CHEI programming, such as where the source BL voltage is 0 volts.

The source voltage applied can be based in part on the characteristics of the memory component such that the predetermined source BL voltage can be high enough (e.g., greater than or equal to 0.5 volts) to facilitate reducing leakage currents associated with the BLs and reducing the programming current, while also increasing programming speed; and at the same time, the predetermined source BL voltage can be low enough so as not to degrade the memory cell (e.g., so as not to degrade the $V_t$ distributions of a non-floating gate multi-bit flash memory cell).

In accordance with still another aspect, methods that can facilitate performing operations associated with a memory component are presented. In another aspect, electronic devices that can comprise a memory component that can contain an optimized voltage component to facilitate performing operations associated with the memory component and/or data associated therewith, in accordance with the disclosed subject matter, and/or can comprise systems that can facilitate performing operations associated with a memory component are presented.

To the accomplishment of the foregoing and related ends, the innovation, then, comprises the features hereinafter fully described and particularly pointed out in the claims. The following description and the annexed drawings set forth in detail certain illustrative embodiments of the innovation. These embodiments are indicative, however, of but a few of the various ways in which the principles of the innovation can be employed. Other objects, advantages, and novel features of the innovation will become apparent from the following detailed description of the innovation when considered in conjunction with the drawings.

DETAILED DESCRIPTION

Figure 1:
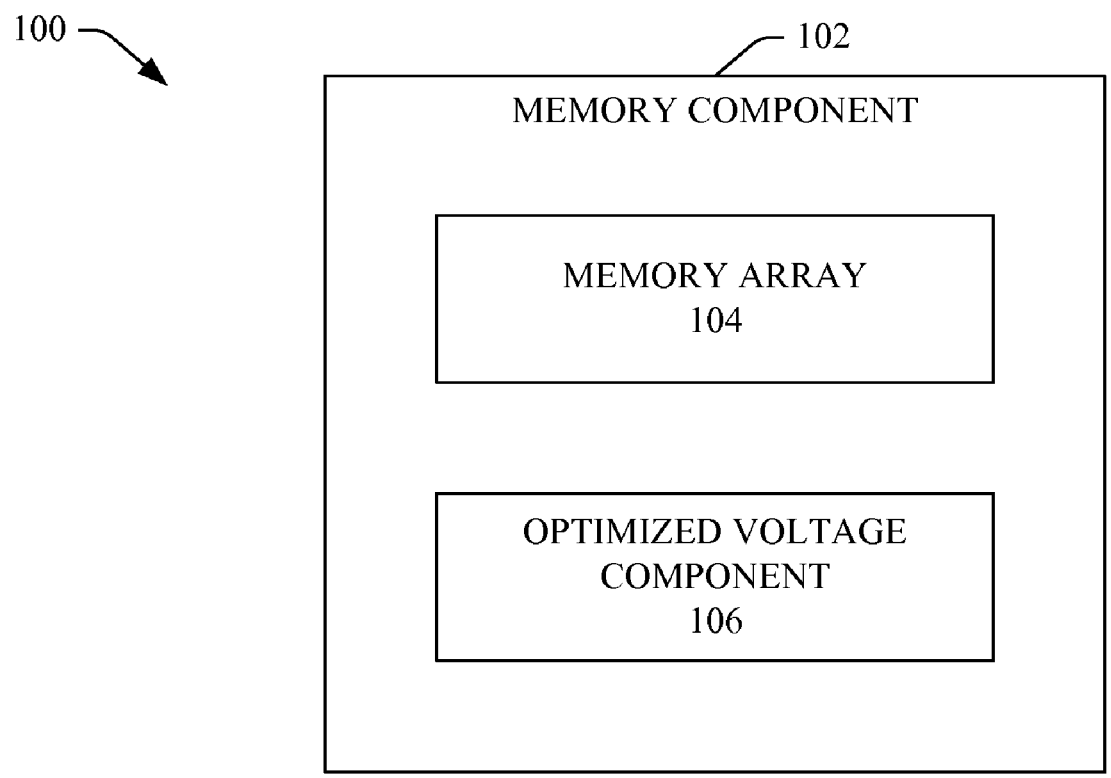
FIG. 1 illustrates a block diagram of a system that can facilitate the performance of operations associated with a memory in accordance with an aspect of the disclosed subject matter.

The disclosed subject matter is described with reference to the drawings, wherein like reference numerals are used to refer to like elements throughout. In the following description, for purposes of explanation, numerous specific details are set forth in order to provide a thorough understanding of the subject innovation. It may be evident, however, that the disclosed subject matter may be practiced without these specific details. In other instances, well-known structures and devices are shown in block diagram form in order to facilitate describing the subject innovation.

The trend in semiconductor memory devices (e.g., flash memory) has been toward higher circuit density with higher numbers of bit cells per device, lower operating voltages, and higher access speeds. To achieve these higher densities there have been, and continue to be, efforts toward scaling down device dimensions (e.g., at sub-micron levels). However, as the desired scaling down of device dimensions occur, bitline (BL) leakage current effects during programming of memory cells in the memory can be increasingly problematic. It would be desirable to reduce and/or eliminate such leakage currents.

Systems and/or methods that can facilitate reducing BL leakage currents during programming are presented. In one aspect, a memory component can contain an optimized voltage component that can facilitate applying a predetermined positive voltage bias to the source BL during programming (e.g., channel hot electron injection (CHEI)) of a memory cell(s) to facilitate reducing leakage currents as well as reducing programming currents, which can result in a more efficient programming of the memory cell and can improve the performance of the memory component, as compared to memory devices that employ conventional CHEI programming.

Turning to the figures, FIG. 1 illustrates a block diagram of a system 100 that can facilitate the performance of operations associated with a memory in accordance with an aspect of the disclosed subject matter. System 100 can include a memory component 102 that can comprise non-volatile memory (e.g., flash memory) and/or volatile memory (e.g., random access memory (RAM)). The memory component 102 can receive information, including data, commands, and/or other information, which the memory component 102 can process (e.g., store data, execute commands, etc.).

Figure 2:
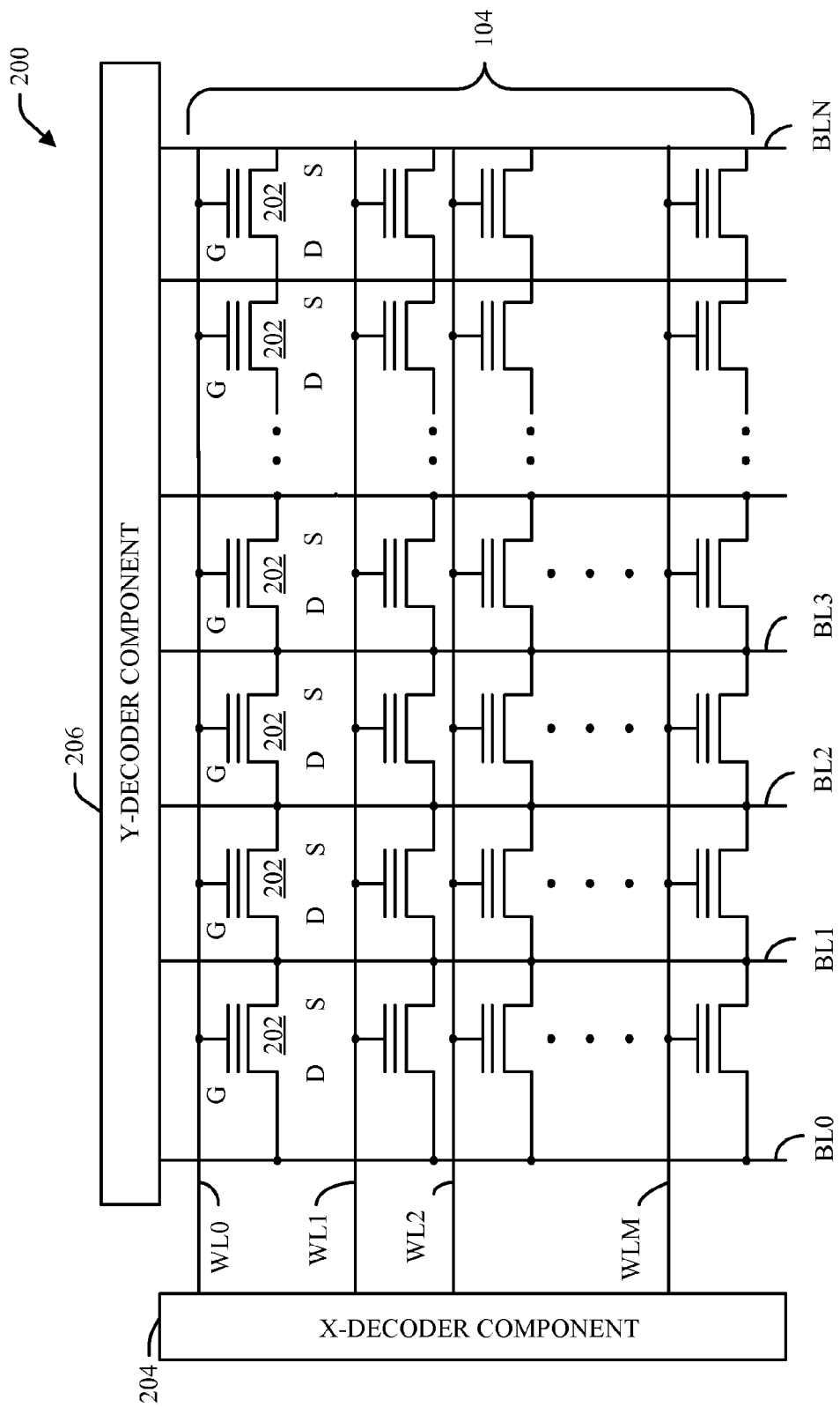
FIG. 2 depicts an example diagram of a system that can be employed to facilitate storage of data in accordance with an aspect of the disclosed subject matter.

The memory component 102 can include a memory array 104 that can receive and store data. The memory array 104 can include a plurality of memory cells (e.g., as depicted in FIG. 2 and described herein) wherein each memory cell can store one or more bits of data. Data stored in a memory cell(s) in the memory array 104 can be read and such data can be provided as an output, or can be erased from the memory cell(s). In accordance with one embodiment, the memory cells can be non-floating gate type memory cells. In accordance with another embodiment, the memory cells can be floating gate type memory cells. The memory array can comprise a plurality of BLs and a plurality of WLs that can cross each other to form the memory array 104, where memory cells can be formed at or near respective locations where the BLs and WLs cross each other in the memory array 104.

Conventionally, CHEI can be employed to facilitate programming data into the memory cells. As memory devices have scaled down and increased in density, components and circuitry with the memory devices has become increasingly more dense. For example, the channel length associated with a memory cell has become smaller. As a result, programming of memory cells by employing conventional CHEI can be problematic, as the shorter channel length can result in undesirable BL leakage currents that can negatively impact programming of memory cells. For example, during conventional CHEI programming of a selected memory cell (e.g., memory cell selected for programming), the voltage at the source BL associated with the memory cell is set at 0 volts, while the voltage at the drain BL associated with the memory cell can be set at a positive voltage level, such as 4.0 volts. The selected memory cell can also have a WL voltage applied. The potential difference between the respective BLs for all non-selected memory cells (e.g., memory cells with no WL voltage applied) can result in BL leakage currents (e.g., where all of the BL leakage currents respectively associated with each non-selected memory cell can yield a collective BL leakage current level), which can negatively impact programming, for example, by decreasing programming speed, increasing the amount of power utilized to program, etc.

In accordance with an aspect of the disclosed subject matter, the memory component 102 can include an optimized voltage component 106 that can facilitate performing operations (e.g., programming) associated with memory cells in the memory component 102. In one aspect, during a programming operation (e.g., CHEI programming), the optimized voltage component 106 can apply respective voltages to BLs (e.g., source BL, drain BL) associated with a selected memory cell (e.g., memory cell selected for programming) such that BL leakage currents can be reduced as compared to conventional CHEI programming. Also, the optimized voltage component 106 can facilitate reducing the programming current for the programming operation, which can result in a savings in power utilized to perform the programming operations, can facilitate increasing the programming speed, and can facilitate improving the reliability of the memory component 102, as compared to conventional memory devices. While the programming current can be reduced, the programming current can still be significantly higher than the leakage current level, if any, associated with the BL, which is desirable.

Figure 3:
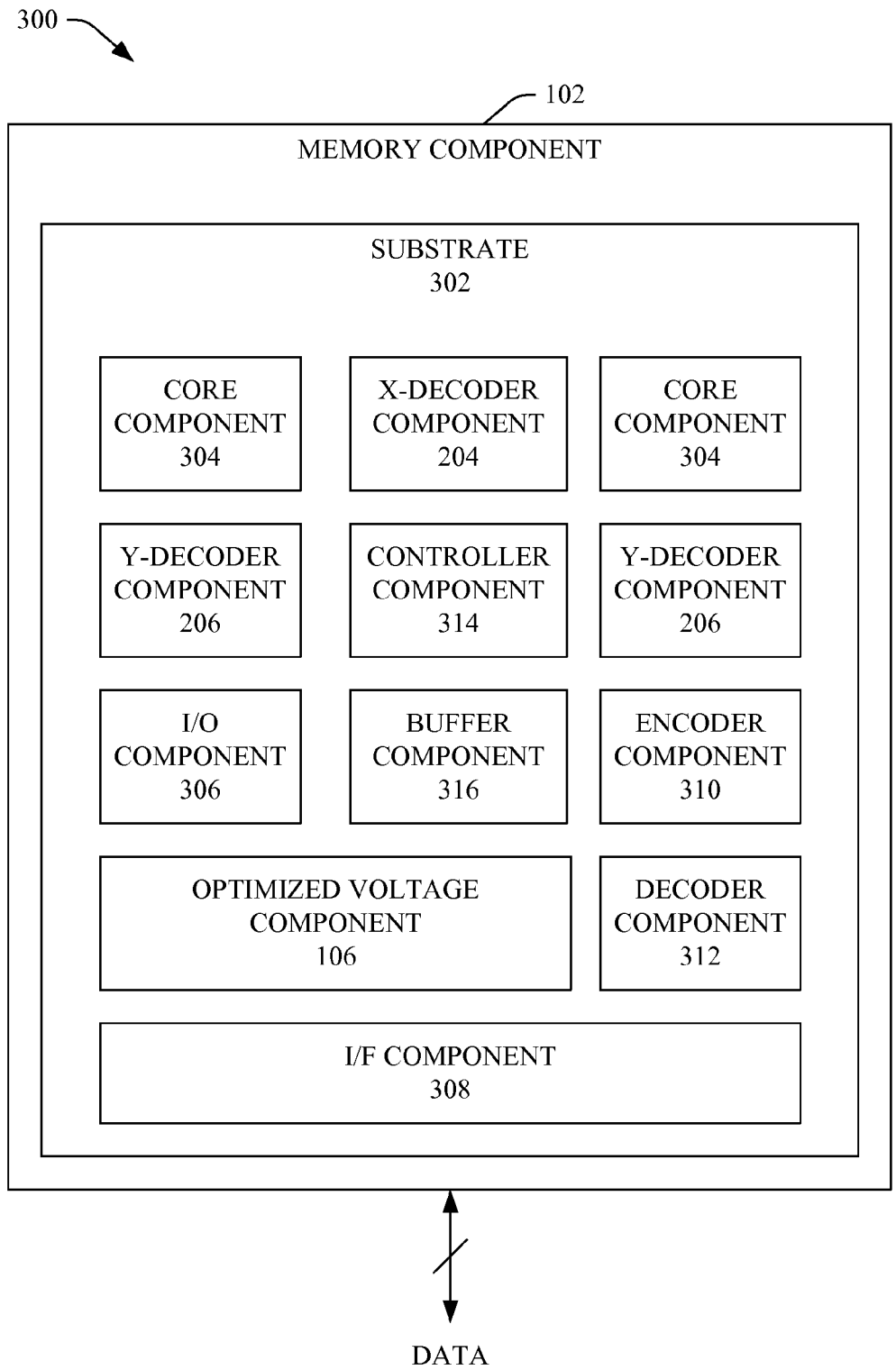
FIG. 3 illustrates a diagram of a memory device that can facilitate storage of data in accordance with an aspect of the disclosed subject matter.

In accordance with an aspect, the optimized voltage component 106 can facilitate programming (e.g., CHEI programming) of a memory cell(s) based in part on providing (e.g., supplying) a predetermined voltage (e.g., positive voltage bias) to the source BL associated with the memory cell(s). In one aspect, during programming (e.g., CHEI), the optimized voltage component 106 can facilitate providing a predetermined source voltage (e.g., $V_s$) to a BL associated with the terminal on a source side of the selected memory cell, where the predetermined source voltage can be at a positive bias (e.g., greater than or equal to 0.5 volts), for example. The optimized voltage component 106 also can provide a predetermined drain voltage (e.g., $V_d$) to a BL associated with a terminal on the drain side of the memory cell. The optimized voltage component 106 can further provide a predetermined WL voltage to the gate terminal of the selected memory cell. Also, the substrate (e.g., as depicted in FIG. 3 and described herein), such as a P-type substrate, on which the memory array 104 can be formed and/or P-well regions associated with the memory array 104 can be at or approximately 0 volts. Based in part on applying a positive bias to the source BL associated with the memory cell, a forward program current (e.g., $V_{ds}$) can be created across the memory cell. As the voltage potential between the source BL and the drain BL is decreased, as compared to conventional CHEI programming, the subject innovation can facilitate a reduction in the program current as compared to the program current associated with conventional CHEI programming (e.g., with the source BL voltage at 0 volts).

In accordance with one aspect, the predetermined source BL voltage applied by the optimized voltage component 106 can be based in part on the characteristics of the memory component 102 and/or the type of memory component 102, such as the characteristics and/or type of the memory cells in the memory component 102. For example, the predetermined BL source voltage can be based in part on whether the memory cells are non-floating gate memory cells or floating gate memory cells, whether the memory cells are multi-bit memory cells or single bit memory cells, the composition of the memory cells, the type of memory cells (e.g., flash memory, EEPROM, etc.), and/or other considerations.

In accordance with another aspect, the predetermined source BL voltage can be based in part on the drain BL voltage being applied to the drain BL, and/or the WL voltage being applied to the WL, associated with the memory cell during an operation (e.g., program operation) on the memory cell, and/or can be based in part on the operation being performed on the memory cell.

In accordance with an aspect, during a program operation (e.g., CHEI program operation) on a memory cell, the predetermined source BL voltage can be a positive voltage bias such that the predetermined source BL voltage level can be high enough (e.g., greater than or equal to 0.5 volts), relative to the drain BL voltage level, to facilitate reducing leakage currents associated with the BLs and/or reducing the programming current, while at the same time, the predetermined source BL voltage level can be low enough so as not to degrade the memory cell, as a source BL voltage that is too high can potentially degrade memory cells, such as, for example, potentially degrading threshold distributions (e.g., $V_t$) associated with a non-floating gate multi-bit flash memory cell. For example, the positive voltage bias applied to the source BL during CHEI programming of a memory cell can range from a voltage level that is greater than 0 volts to 1.0 volt or greater, where a preferred positive voltage bias for a source BL can range from 0.5 volts to 1.0 volt, inclusive.

In accordance with one non-limiting example embodiment of the disclosed subject matter, a plurality of memory cells can be in a memory array 104 of the memory component 102 and can be respectively associated with WLs and BLs that form the memory array 104. The memory cells can be non-floating gate multi-bit flash memory cells. During CHEI programming of a selected memory cell, the optimized voltage component 106 can facilitate supplying a predetermined BL source voltage, $V_s$, of 1.0 volts to the source BL associated with the terminal on the source side of the selected memory cell; supplying a predetermined BL drain voltage, $V_d$, of 4.5 volts to the drain BL associated with the terminal on the drain side of the selected memory cell; and supplying a predetermined WL voltage, $V_g$, of 9.0 volts to the gate terminal associated with the selected memory cell. As a result, there can be a program current corresponding to the voltage potential, $V_{ds}$, between the source BL and the drain BL, where $V_{ds}$ can be 3.5 volts.

Conventionally, during a CHEI programming of a selected memory cell, a BL drain voltage, $V_d$, of 4.0 volts can be applied to the drain BL associated with the terminal on the drain side of the selected memory cell; and a WL voltage, $V_g$, of 9.0 volts can be applied to the gate terminal associated with the selected memory cell. The source BL can remain at 0 volts. As a result, there can be a program current corresponding to the voltage potential, $V_{ds}$, between the source BL and the drain BL, where $V_{ds}$ can be 4.0 volts.

As can be seen, the program current associated with the subject innovation can be lower than the program current associated with the conventional CHEI programming operation. Thus, the subject innovation can facilitate programming memory cells using less power than conventional CHEI programming. Further, the positive voltage bias applied to the source BL during programming by the optimized voltage component 106 can facilitate reducing BL leakage currents, such as BL leakage currents across or near unselected WLs (e.g., at 0 volts) associated with the BLs. The subject innovation can also thereby provide for increased programming speed and increased reliability of the memory component 102.

Referring back to the memory component 102, the memory component can comprise nonvolatile memory and/or volatile memory. The nonvolatile memory can comprise, but is not limited to, read-only memory (ROM), flash memory (e.g., single-bit flash memory, multi-bit flash memory), mask-programmed ROM, programmable ROM (PROM), Erasable PROM (EPROM), Ultra Violet (UV)-erase EPROM, one-time programmable ROM, electrically erasable PROM (EEPROM), and/or nonvolatile RAM (e.g., ferroelectric RAM (FeRAM)). A flash memory can be comprised of NAND memory and/or NOR memory, for example. The flash memory can be non-floating gate multi-bit flash memory (e.g., ORPRO memory) or floating gate flash memory. Volatile memory can include, but is not limited to, RAM, static RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), Rambus direct RAM (RDRAM), direct Rambus dynamic RAM (DRDRAM), and Rambus dynamic RAM (RDRAM).

Referring to FIG. 2, illustrated is a system 200 that can facilitate data storage in accordance with one aspect of the disclosed subject matter. System 200 can comprise a portion of the memory component 102 (e.g., as illustrated in FIG. 1 and described herein), which can include a memory array 104 that can comprise a plurality of memory cells 202 that each can be comprised of a drain (D), gate (G), and source (S). Each memory cell 202 can have one or more levels therein and can store one or more bits of data therein. The portion of the memory component 102, the memory array 104, and the memory cells 202 each can be the same or similar to, and/or can contain the same or similar functionality as, respective components (or respective portions thereof), as more fully described herein, for example, with regard to system 100.

The memory array 104 can be associated with an x-decoder component 204 (e.g., WL decoder) and a y-decoder component 206 (e.g., BL decoder) that can each respectively decode inputs/outputs during various operations (e.g., programming, reading, verifying, erasing) that can be performed on the memory cells 202. The x-decoder component 204 and y-decoder component 206 can each receive address bus information and/or other information, and can utilize such information to facilitate accessing or selecting the desired memory cell(s) 202 (e.g., memory location(s)) associated with the command.

The memory cells 202 can be formed in M rows and N columns, where M and N can each be an integer number. A common WL can be attached to the gate of each memory cell 202 in a row, such as word-lines WL0, WL1, WL2, through WLM. A common BL can be attached to each memory cell 202 in a column, such as bit-lines BL0, BL1, through BLN. A WL can contain, for example, 1024 storage elements (within memory cells 202) forming multiple words and a sector (not shown) can include, for example, 512 WLs to provide at least 512 k elements of memory, where there can be a plurality of sectors in a memory array 104. In accordance with an aspect of the disclosed subject matter, respective voltages can be applied to one or more memory cells 202 through the WLs and BLs to facilitate performing operations, such as program, read, erase, verify, and the like.

Turning to FIG. 3, depicted is a diagram of a memory device 300 that can facilitate storage of data in accordance with an aspect of the disclosed subject matter. Memory device 300 can include a memory component 102 that can comprise a non-volatile memory (e.g., flash memory) and/or volatile memory (e.g., random access memory (RAM)). The memory component 102 can receive information, including data, commands, and/or other information, which the memory component 102 can process (e.g., store data, execute commands, etc.). The memory component 102 can include a memory array 104 (e.g., as illustrated in FIGS. 1 and 2, and described herein) that can comprise a plurality of memory cells (e.g., as illustrated in FIG. 2 and described herein) to facilitate data storage, and an optimized voltage component 106 that can facilitate applying and/or controlling voltages during operations (e.g., programming, reading, erasing, verifying) associated with the memory component 102. The memory component 102, memory array 104, and optimized voltage component 106 each can be the same or similar as, and/or each can contain the same or similar functionality as, respective components, as more fully described herein, for example, with regard to system 100 and/or system 200.

In one aspect, the memory component 102, including the optimized voltage component 106, and other components described herein, for example, with regard to memory device 300 can be formed and/or contained on a substrate 302 (e.g., semiconductor substrate). In another aspect, one or more core components 304 (e.g., high-density core regions) and one or more lower-density peripheral regions can be formed on the substrate 302. The core component(s) 304 typically can include one or more M by N arrays (e.g., memory array 104) of individually addressable, substantially identical memory cells, which can be multi-bit memory cells, in accordance with one embodiment. The lower-density peripheral regions can typically include an input/output component 306 (e.g., input/output (I/O) circuitry) and programming circuitry for selectively addressing the individual memory cells. The programming circuitry can be represented in part by and can include one or more x-decoder components 204 and one or more y-decoder components 206 that can cooperate with the I/O component 306 for selectively connecting a source (not shown), gate (not shown), and/or drain (not shown) of selected addressed memory cells to predetermined voltages or impedances to effect designated operations (e.g., programming, reading, verifying, erasing) on the respective memory cells, and deriving necessary voltages to effect such operations. For example, an x-decoder component 204 and a y-decoder component 206 can each receive address bus information, which can be provided as part of a command, and such information can be utilized to facilitate determining the desired memory cell(s) in the memory component 102.

The memory component 102 can receive information (e.g., data, commands, etc.) via an interface component 308 (also referred to herein as "I/F 308"), which can also be formed on substrate 302. I/F 308 can include and/or provide various adapters, connectors, channels, communication paths, etc. to integrate the memory component 102 into virtually any operating and/or database system(s) and/or with one another system(s). In addition, I/F 308 can provide various adapters, connectors, channels, communication paths, etc., that can provide for interaction and/or communication with a processor component (not shown), and/or any other component, data, and the like, associated with the memory device 300.

The memory component 102 can also contain an encoder component 310 that can facilitate encoding data being programmed to the memory component 102, where the encoder component 310 also can be formed on the substrate 302. For example, the encoder component 310 can facilitate converting a digital signal to an analog signal (e.g., current level) to facilitate programming data in the memory locations (e.g., memory cells) in the memory component 102.

The memory component 102 can further include a decoder component 312 that can facilitate decoding data being read from the memory component 102. The decoder component 312 can sense and/or receive an analog signal associated with data, where the analog signal can be stored in the memory location in the memory array 104, and can facilitate converting the analog signal to a digital signal, so that such digital signal representing the read data can be provided to another component (e.g., processor component) for further processing.

Figure 5:
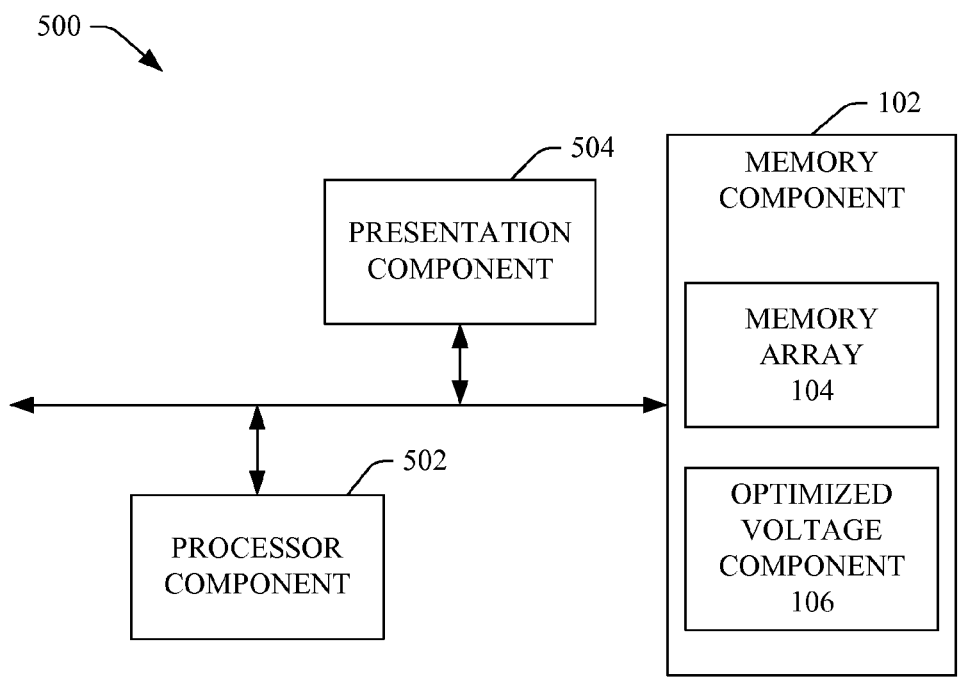
FIG. 5 illustrates a system that can facilitate access of data in accordance with an aspect of the subject innovation.

In one aspect, the memory component 102 can also include a controller component 314 that can facilitate control of the flow of data to and from the memory component 102. In an aspect, the controller component 314, by itself or in conjunction with a processor component (e.g., as depicted in FIG. 5 and described herein), can facilitate execution of operations (e.g., read, write, verify, erase) associated with memory locations (e.g., memory cells) in the memory array 104. In another aspect, the controller component 314 can facilitate verifying and/or maintaining the desired charge level(s) associated with data stored in the memory locations in the memory array 104. In accordance with yet another aspect, the controller component 314 can work in conjunction with the optimized voltage component 106 to facilitate performing operations (e.g., facilitate supplying predetermined source BL voltage, drain BL voltage, and/or predetermined WL voltage) on memory cells in the memory component 102. In still another aspect, a buffer component 316 can be formed on the substrate 302. The buffer component 316 can facilitate storage of data, for example, to temporarily store data, being written to and/or read from the memory array 104.

Figure 4:
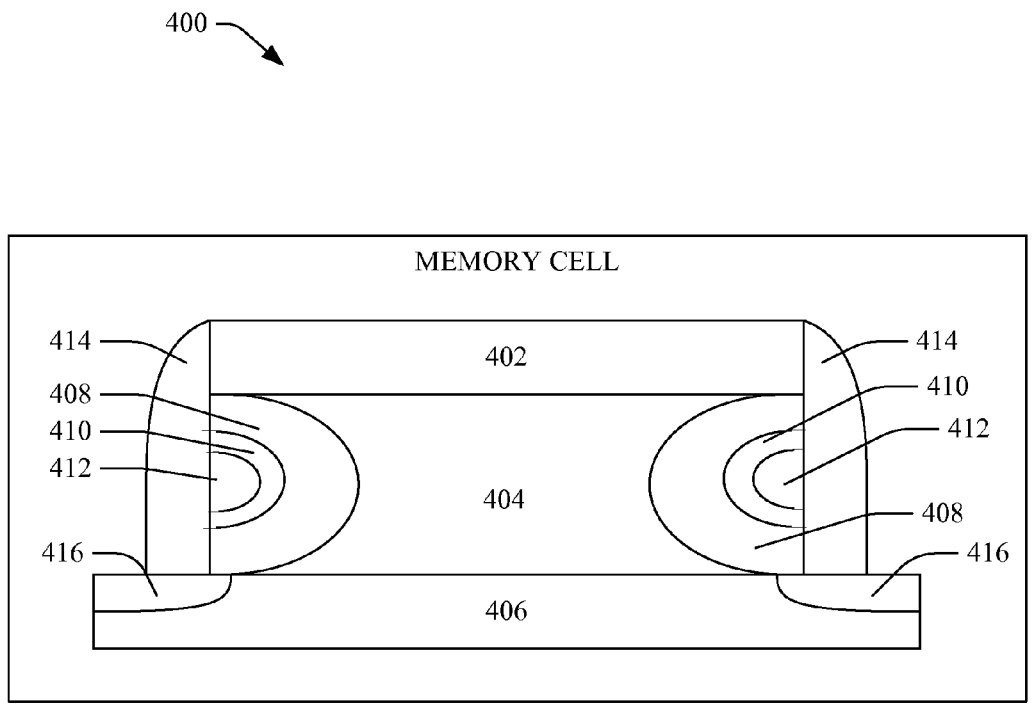
FIG. 4 depicts a memory cell that can be associated with a memory in accordance with an embodiment of the subject innovation.

Referring to FIG. 4, depicted is a memory cell 400 that can be associated with a memory in accordance with an aspect of the disclosed subject matter. In one aspect, the memory cell 400 can be formed as a stack that can be comprised of a gate layer 402, which can be comprised of a P+ polycrystalline silicon or an N-type silicon, overlying a gate oxide layer 404 that can be formed over a semiconductor substrate 406 and have one or more charge storage elements in each undercut region. In other embodiments, the gate layer 402 can be replaced with other material(s) with a high work function, such as a p-type metal. The illustrated charge storage element(s) can include a tunnel oxide layer 408, a silicon rich nitride layer 410, and/or the charge trapping layer 412. The charge trapping layer 412 can be made of polycrystalline silicon and can be surrounded by the silicon rich nitride layer 410. In one aspect, charge can be trapped and/or stored in the charge trapping layer 412 and/or the silicon rich nitride layer 410 of a charge storage element(s) during an operation on the memory cell 400 to facilitate setting the memory cell 400 to a desired data state based in part on the level of charge stored in the charge storage element(s) in the memory cell 400. One will appreciate that other materials, such as other nitrides or combination of nitride and silicon rich nitride, can alternatively be used.

Overlaying the silicon rich nitride layer 410 in the illustration can be a tunnel oxide layer 408. Sidewall spacers 414 can be formed around the periphery of the gate layer 402 and silicon oxide (not shown) can be filled in between the sidewall spacers 414. Bit lines 416 can act as a source/drain depending on the operation (e.g., read, programming) being performed and the charge storage element upon which the operation is being performed.

The memory cell 400, with its regions having an oxide layer/silicon rich nitride layer/polysilicon layer/silicon rich nitride layer/oxide layer can also be referred to as an ORPRO memory cell. In accordance with one aspect, the memory cell 400 can be a non-floating gate type of flash memory cell that can be employed in a flash memory. In accordance with one embodiment, the memory component 102 (e.g., as illustrated in FIG. 1 and described herein) can be comprised of a plurality of memory cells contained in the memory array 104 (e.g., as illustrated in FIG. 1 and described herein), which can be the same as or similar to the memory cell 400. In accordance with another aspect, the memory cell 400 can store one or more bits of data, where an amount of charge that can represent the stored bits of data can be stored in the charge trapping layer(s) (e.g., 412) of the memory cell 400.

It is to be appreciated that, in accordance with various other embodiments of the disclosed subject matter, the memory component 102 can comprise other types of non-floating gate type flash memory cells (e.g., metal-nitride-oxide-semiconductor (MNOS) memory cells, continuous non-floating gate flash memory cells, etc.), floating gate type flash memory cells, or other types of nonvolatile memory cells (e.g., EPROM, EEPROM, etc.), where the optimized voltage component 106 (e.g., as illustrated in FIG. 1 and described herein) can facilitate efficiently performing operations (e.g., programming using CHEI) with regard to such memory cells.

Referring to FIG. 5, depicted is a block diagram of a system 500 that can facilitate access of data associated with a memory in accordance with an aspect of the disclosed subject matter. System 500 can include a memory component 102 that can be comprised of a non-volatile memory (e.g., single-bit flash memory, multi-bit flash memory) and/or volatile memory (e.g., SRAM). The memory component 102 can include a memory array 104 that can be comprised of a plurality of memory cells (e.g., memory cell 202, memory cell 400, as described herein), which can be memory locations, wherein, for each memory cell, one or more bits of data can be stored, and from which stored data can be read. The memory component 102 can also include an optimized voltage component 106 that can facilitate controlling and/or supplying respective voltages to respective terminals of memory cells to facilitate performing operations (e.g., program, read, erase, verify) on memory cells in the memory array 104. It is to be appreciated that the memory component 102, memory array 104, and optimized voltage component 106 each can be the same or similar as respective components, and/or can contain the same or similar functionality as respective components, as more fully described herein, for example, with regard to system 100, system 200, and/or memory device 300.

In one aspect, system 500 can include a processor component 502 that can be associated with the memory component 102 and other components via a bus. In accordance with an embodiment of the disclosed subject matter, the processor component 502 can be a typical applications processor that can manage communications and run applications. For example, the processor component 502 can be a processor that can be utilized by a computer, mobile handset, personal data assistant (PDA), or other electronic device. The processor component 502 can generate and/or provide (e.g., transmit) commands, including read, program, and/or erase commands, in order to facilitate reading data from, programming data to, and/or erasing data from the memory component 102.

The communication of information between the processor component 502, the memory component 102, and other components (e.g., cryptographic component (not shown), authentication component (not shown)), can be facilitated via a bus that can be comprised of any of several types of bus structure(s) including, but not limited to, a peripheral bus or external bus, and/or a local bus using any variety of available bus architectures including, but not limited to, bus structures related to Open NAND Flash Interface, Compact Flash Interface, Multimedia Card (MMC), Secure Digital (SD), CE-ATA, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Personal Computer Memory Card International Association bus (PCMCIA), Firewire (IEEE 1394), and Small Computer Systems Interface (SCSI).

System 500 also can include a presentation component 504, which can be associated with the host processor 502. The presentation component 504 that provides various types of user interfaces to facilitate interaction between a user and any component coupled to the host processor 502. As depicted, the presentation component 504 is a separate entity that can be utilized with the host processor 502 and associated components. However, it is to be appreciated that the presentation component 504 and/or similar view components can be incorporated into the host processor 502 and/or a stand-alone unit. The presentation component 504 can provide one or more graphical user interfaces (GUIs), command line interfaces, and the like. For example, a GUI can be rendered that provides a user with a region or means to load, import, read, etc., data, and can include a region to present the results of such. These regions can comprise known text and/or graphic regions comprising dialogue boxes, static controls, drop-down-menus, list boxes, pop-up menus, as edit controls, combo boxes, radio buttons, check boxes, push buttons, and graphic boxes. In addition, utilities to facilitate the presentation such as vertical and/or horizontal scroll bars for navigation and toolbar buttons to determine whether a region will be viewable can be employed. For example, the user can interact with one or more of the components coupled to and/or incorporated into the host processor 502.

The user can also interact with the regions to select and provide information via various devices such as a mouse, a roller ball, a keypad, a keyboard, a pen and/or voice activation, for example. Typically, a mechanism such as a push button or the enter key on the keyboard can be employed subsequent entering the information in order to initiate the search. However, it is to be appreciated that the claimed subject matter is not so limited. For example, merely highlighting a check box can initiate information conveyance. In another example, a command line interface can be employed. For example, the command line interface can prompt (e.g., via a text message on a display and an audio tone) the user for information via providing a text message. The user can than provide suitable information, such as alpha-numeric input corresponding to an option provided in the interface prompt or an answer to a question posed in the prompt. It is to be appreciated that the command line interface can be employed in connection with a GUI and/or API. In addition, the command line interface can be employed in connection with hardware (e.g., video cards) and/or displays (e.g., black and white, and EGA) with limited graphic support, and/or low bandwidth communication channels.

The aforementioned systems and/or devices have been described with respect to interaction between several components. It should be appreciated that such systems and components can include those components or sub-components specified therein, some of the specified components or sub-components, and/or additional components. Sub-components could also be implemented as components communicatively coupled to other components rather than included within parent components. Further yet, one or more components and/or sub-components may be combined into a single component providing aggregate functionality. The components may also interact with one or more other components not specifically described herein for the sake of brevity, but known by those of skill in the art.

Figure 6:
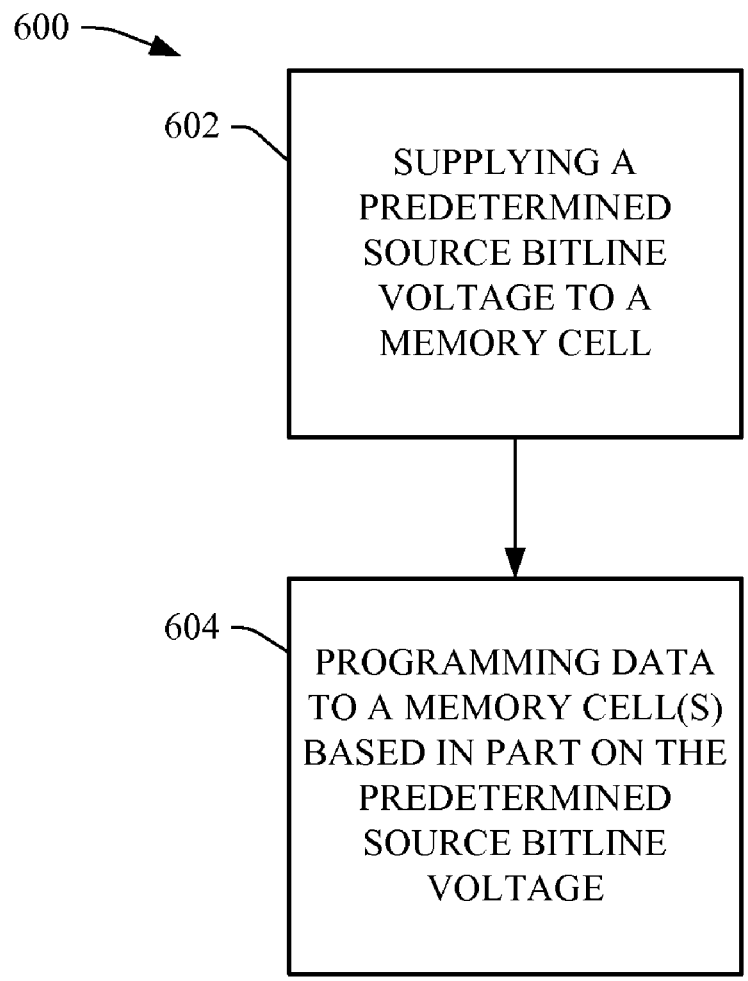
FIG. 6 illustrates a methodology that can facilitate programming data in a memory in accordance with an aspect of the disclosed subject matter.
Figure 7:
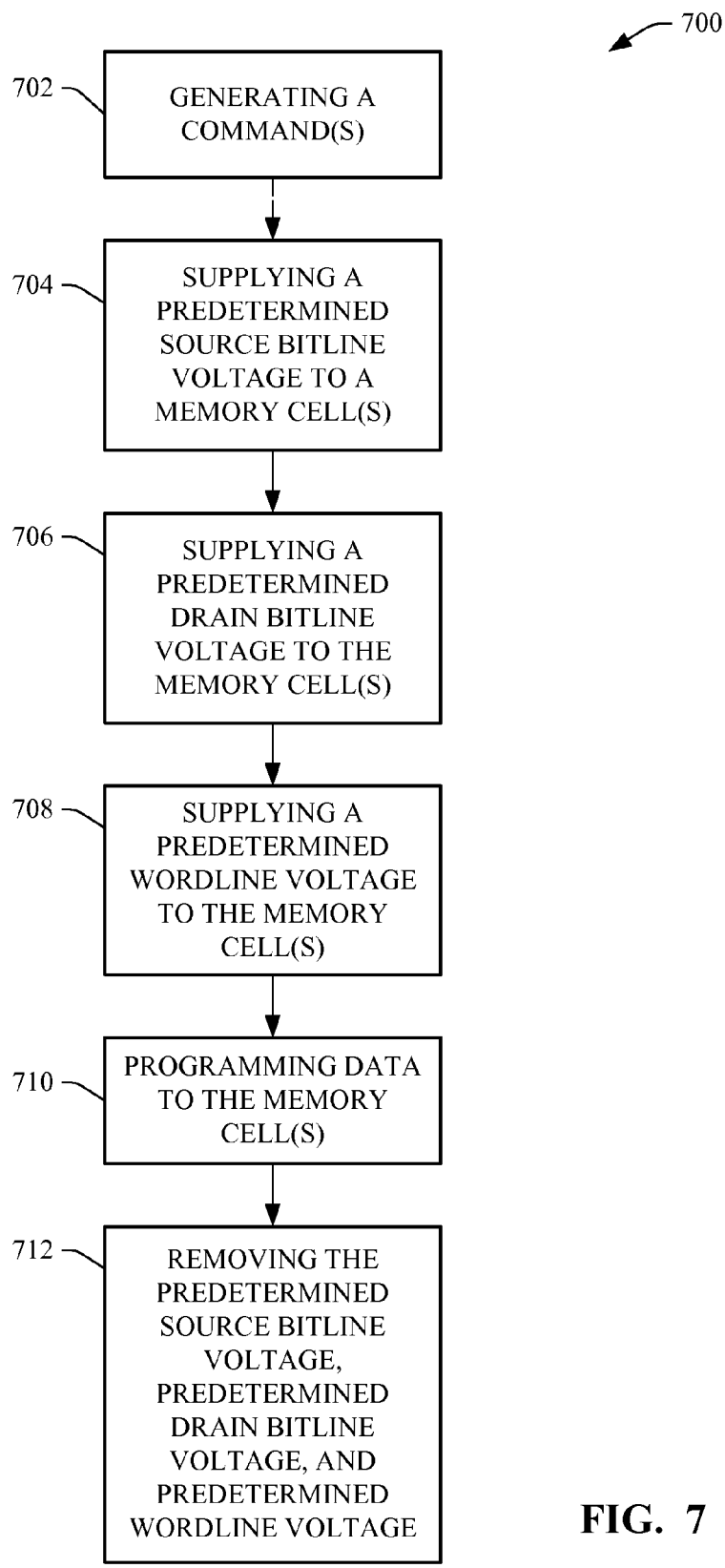
FIG. 7 depicts another methodology that can facilitate programming data in a memory in accordance with an aspect of the disclosed subject matter.

FIGS. 6-7 illustrate methodologies and/or flow diagrams in accordance with the disclosed subject matter. For simplicity of explanation, the methodologies are depicted and described as a series of acts. It is to be understood and appreciated that the subject innovation is not limited by the acts illustrated and/or by the order of acts, for example acts can occur in various orders and/or concurrently, and with other acts not presented and described herein. Furthermore, not all illustrated acts may be required to implement the methodologies in accordance with the disclosed subject matter. In addition, those skilled in the art will understand and appreciate that the methodologies could alternatively be represented as a series of interrelated states via a state diagram or events. Additionally, it should be further appreciated that the methodologies disclosed hereinafter and throughout this specification are capable of being stored on an article of manufacture to facilitate transporting and transferring such methodologies to computers. The term article of manufacture, as used herein, is intended to encompass a computer program accessible from any computer-readable device, carrier, or media.

Referring to FIG. 6, a methodology 600 that can facilitate programming data to a memory cell(s) associated with a memory in accordance with an aspect of the disclosed subject matter is illustrated. At 602, a predetermined source BL voltage (e.g., $V_s$) can be supplied to a memory cell (e.g., 202, 400). In accordance with an aspect, a memory component (e.g., 102) can comprise a memory array (e.g., 104) that can contain a plurality of memory cells. The memory array can include a plurality of WLs and BLs that can form the memory array, where the memory cells can be formed in respective locations in the array where respective WLs and BLs cross. In accordance with one embodiment, the memory cells can be non-floating gate flash memory cells (e.g., multi-bit ORPRO flash memory cells). In another embodiment, the memory cells can be floating gate type nonvolatile memory cells (e.g., flash memory, EEPROM, etc.).

In accordance with one aspect, during a CHEI programming operation, an optimization component (e.g., 106) can facilitate supplying a predetermined source BL voltage to the source BL associated with the terminal on the source side of the memory cell to facilitate reducing BL leakage currents during programming. In one aspect, the source BL voltage can be a positive voltage bias that is greater than 0 volts. In various embodiments, the source BL voltage can be greater than or equal to 0.5 volts, with preferred source BL voltage levels of 0.8 volts or more. The maximum source BL voltage can be such that it does not cause the memory cell to degrade, which can be based in part on the particular structure of the memory cell.

At 604, data can be programmed to the memory cell based in part on the predetermined source BL voltage. In one aspect, the optimized voltage component can supply respective predetermined voltages to the source BL, drain BL, and WL associated with the gate, connected with the memory cell(s) being programmed to facilitate programming data to the memory cell(s). For example, the optimized voltage component can supply a predetermined source BL voltage (e.g., 1.0 volt) to the source BL associated with the memory cell, a predetermined drain BL voltage (e.g., 4.5 volts) to the drain BL associated with the memory cell, and a predetermined WL voltage (e.g., 9.0 volts) to the WL associated with the gate of the memory cell to program data to the memory cell.

Methodology 600, by supplying a positive bias to the source BL during CHEI programming, can facilitate reducing undesirable BL leakage currents, which can otherwise result due to the short channel length between the source and drain BLs, and, as a result, programming of memory cells can be improved over conventional programming techniques. As further result, methodology 600 can facilitate reducing the programming current, which can result in less power being utilized during programming, increasing programming speed, and improving the reliability of the memory devices (e.g., memory component 102). At this point, methodology 600 can end.

Turning to FIG. 7, depicted is a methodology 700 that can facilitate programming of memory cells associated with a memory in accordance with an aspect of the disclosed subject matter. At 702, a program command (e.g., write command) can be generated. In one aspect, a processor component (e.g., 502) can generate a program command to facilitate programming data to one or more memory cells (e.g., 202, 400) in a memory component (e.g., 102). At 704, a predetermined source BL voltage (e.g., $V_s$) can be supplied to a memory cell(s) (e.g., 202, 400).

In accordance with an aspect, the memory component can comprise a memory array (e.g., 104) that can contain a plurality of memory cells. The memory array can include a plurality of WLs and BLs that can be formed as an array (e.g., WLs parallel to an x-axis and BLs parallel to a y-axis, where WLs and BLs can cross each other in the array), where the memory cells can be formed in respective locations in the array where respective WLs and BLs cross. In accordance with one embodiment, the memory cells can be non-floating gate flash memory cells (e.g., multi-bit ORPRO flash memory cells). In another embodiment, the memory cells can be floating gate type memory cells (e.g., flash memory, EEPROM, etc.).

In accordance with one aspect, during a CHEI programming operation, an optimization component (e.g., 106) can facilitate supplying a predetermined source BL voltage to the source BL associated with the terminal on the source side of the memory cell to facilitate reducing BL leakage currents during programming. In one aspect, the source BL voltage can be a positive voltage bias that is greater than 0 volts (e.g., 0.5 volts or more).

At 706, a predetermined drain BL voltage (e.g., $V_d$) can be supplied. In one aspect, the optimized voltage component can facilitate supplying the predetermined drain BL voltage (e.g., 4.5 volts) to the drain BL associated with the drain side of the memory cell(s) being programmed. At 708, a predetermined WL voltage (e.g., $V_g$) can be supplied to a WL associated with the memory cell. In one aspect, the optimized voltage component can facilitate supplying the predetermined WL voltage (e.g., 9 volts, 10 volts, ... ), which can also be referred to as a gate voltage, to the gate(s) of the memory cell(s) being programmed.

In accordance with one aspect, the predetermined source BL can be determined based in part on the predetermined drain BL voltage and/or the predetermined WL voltage supplied to the memory cell during programming. In accordance with another aspect, the predetermined BL voltage can be determined based in part on the type of memory cell in the memory component and/or characteristics associated with the memory component and/or memory cells therein.

At 710, data can be programmed to the memory cell(s). In one aspect, the data can be programmed to the memory cell based in part on the predetermined source BL voltage supplied to the source BL associated with the memory cell(s) being programmed. At 712, the predetermined source BL voltage, predetermined drain BL voltage, and predetermined WL voltage, associated with the memory cell(s) can be removed. In one aspect, after the data is programmed to the memory cell(s), the optimized voltage component can facilitate removing and/or can discontinue supplying the predetermined source BL voltage, predetermined drain BL voltage, and predetermined WL voltage, associated with the memory cell(s) that was programmed.

Methodology 700, by supplying a positive bias to the source BL during CHEI programming, can facilitate reducing undesirable BL leakage currents, which can otherwise result due to the short channel length between the source and drain BLs, and, as a result, programming of memory cells can be improved over conventional programming techniques. As further result, methodology 700 can facilitate reducing the programming current, which can result in less power being utilized during programming, an increase in programming speed, and an improvement in the reliability of the memory devices (e.g., memory component 102), as compared to conventional memory devices. At this point, methodology 700 can end.

Figure 8:
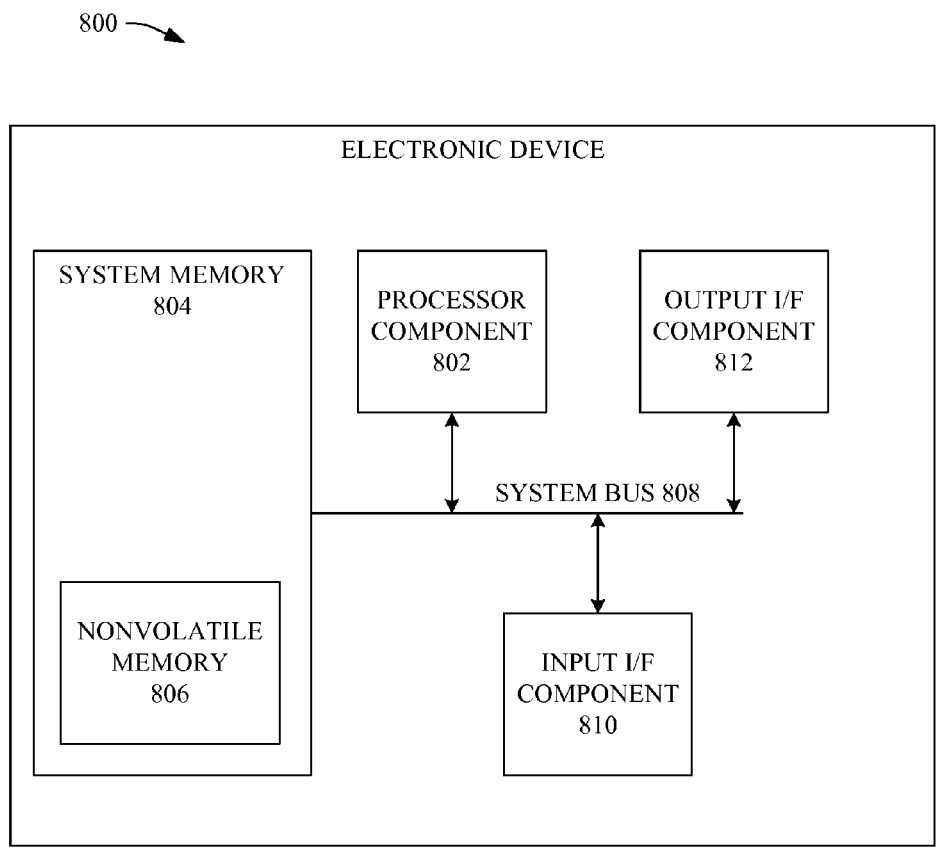
FIG. 8 illustrates an example of an electronic device that can be associated with a memory in accordance with an aspect of the disclosed subject matter.

Referring to FIG. 8, illustrated is a block diagram of an exemplary, non-limiting electronic device 800 that can comprise and/or incorporate system 100, system 200, memory device 300, memory cell 400, and/or system 500, or a respective portion(s) thereof. The electronic device 800 can include, but is not limited to, a computer, a laptop computer, network equipment (e.g., routers, access points), a media player and/or recorder (e.g., audio player and/or recorder, video player and/or recorder), a television, a smart card, a phone, a cellular phone, a smart phone, an electronic organizer, a PDA, a portable email reader, a digital camera, an electronic game (e.g., video game), an electronic device associated with digital rights management, a Personal Computer Memory Card International Association (PCMCIA) card, a trusted platform module (TPM), a Hardware Security Module (HSM), set-top boxes, a digital video recorder, a gaming console, a navigation system or device (e.g., global position satellite (GPS) system), a secure memory device with computational capabilities, a device with a tamper-resistant chip(s), an electronic device associated with an industrial control system, an embedded computer in a machine (e.g., an airplane, a copier, a motor vehicle, a microwave oven), and the like.

Components of the electronic device 800 can include, but are not limited to, a processor component 802 (e.g., which can be and/or can include the same or similar functionality as processor component 502, as depicted in FIG. 5 and described herein), a system memory 804, which can contain a nonvolatile memory 806, and a system bus 808 that can couple various system components including the system memory 804 to the processor component 802. The system bus 808 can be any of several types of bus structures including a memory bus or memory controller, a peripheral bus, or a local bus using any of a variety of bus architectures.

Electronic device 800 can typically include a variety of computer readable media. Computer readable media can be any available media that can be accessed by the electronic device 800. By way of example, and not limitation, computer readable media can comprise computer storage media and communication media. Computer storage media includes volatile and non-volatile, removable and non-removable media implemented in any method or technology for storage of information such as computer readable instructions, data structures, program modules or other data. Computer storage media includes, but is not limited to, RAM, ROM, EEPROM, nonvolatile memory 806 (e.g., flash memory), or other memory technology, CD-ROM, digital versatile disks (DVD) or other optical disk storage, magnetic cassettes, magnetic tape, magnetic disk storage or other magnetic storage devices, or any other medium which can be used to store the desired information and which can be accessed by electronic device 800. Communication media typically embodies computer readable instructions, data structures, program modules or other data in a modulated data signal such as a carrier wave or other transport mechanism and includes any information delivery media.

The system memory 804 can include computer storage media in the form of volatile (e.g., SRAM) and/or nonvolatile memory 806 (e.g., flash memory). For example, nonvolatile memory 806 can be the same or similar, or can contain the same or similar functionality, as memory component 102 (e.g., as described herein with regard to system 100, system 200, system 500, etc.). A basic input/output system (BIOS), containing the basic routines that can facilitate transferring information between elements within electronic device 800, such as during start-up, can be stored in the system memory 804. The system memory 804 typically also can contain data and/or program modules that can be accessible to and/or presently be operated on by the processor component 802. By way of example, and not limitation, the system memory 804 can also include an operating system(s), application programs, other program modules, and program data.

The nonvolatile memory 806 can be removable or non-removable. For example, the nonvolatile memory 806 can be in the form of a removable memory card or a USB flash drive. In accordance with one aspect, the nonvolatile memory 806 can include flash memory (e.g., single-bit flash memory, multi-bit flash memory), ROM, PROM, EPROM, EEPROM, or NVRAM (e.g., FeRAM), or a combination thereof, for example. Further, a flash memory can comprise NOR flash memory and/or NAND flash memory.

A user can enter commands and information into the electronic device 800 through input devices (not shown) such as a keypad, microphone, tablet, or touch screen although other input devices can also be utilized. These and other input devices can be connected to the processor component 802 through input interface component 810 that can be connected to the system bus 808. Other interface and bus structures, such as a parallel port, game port or a universal serial bus (USB) can also be utilized. A graphics subsystem (not shown) can also be connected to the system bus 808. A display device (not shown) can be also connected to the system bus 808 via an interface, such as output interface component 812, which can in turn communicate with video memory. In addition to a display, the electronic device 800 can also include other peripheral output devices such as speakers (not shown), which can be connected through output interface component 812.

It is to be understood and appreciated that the computer-implemented programs and software can be implemented within a standard computer architecture. While some aspects of the disclosure have been described above in the general context of computer-executable instructions that can be run on one or more computers, those skilled in the art will recognize that the technology also can be implemented in combination with other program modules and/or as a combination of hardware and software.

Generally, program modules include routines, programs, components, data structures, etc., that perform particular tasks or implement particular abstract data types. Moreover, those skilled in the art will appreciate that the inventive methods can be practiced with other computer system configurations, including single-processor or multiprocessor computer systems, minicomputers, mainframe computers, as well as personal computers, hand-held computing devices (e.g., PDA, phone), microprocessor-based or programmable consumer electronics, and the like, each of which can be operatively coupled to one or more associated devices.

The illustrated aspects of the disclosure may also be practiced in distributed computing environments where certain tasks are performed by remote processing devices that are linked through a communications network. In a distributed computing environment, program modules can be located in both local and remote memory storage devices.

It is also to be understood and appreciated that cryptographic protocols can be employed to facilitate security of data associated with a memory (e.g., memory component 102) in accordance with the disclosed subject matter. For example, a cryptographic component (e.g., cryptographic engine) can be employed and can facilitate encrypting and/or decrypting data to facilitate securing data being written to, stored in, and/or read from the memory. The cryptographic component can provide symmetric cryptographic tools and accelerators (e.g., Twofish, Blowfish, AES, TDES, IDEA, CAST5, RC4, etc.) to facilitate securing data. The cryptographic component can also provide asymmetric cryptographic accelerators and tools (e.g., RSA, Digital Signature Standard (DSS), and the like) to facilitate securing data. Additionally, the cryptographic component can provide accelerators and tools (e.g., Secure Hash Algorithm (SHA) and its variants such as, for example, SHA-0, SHA-1, SHA-224, SHA-256, SHA-384, and SHA-512) to facilitate securing data.

It is to be appreciated and understood that authentication protocols can be employed to facilitate security of data associated with the memory (e.g., memory component 102) in accordance with the disclosed subject matter. For example, an authentication component can solicit authentication data from an entity, and, upon the authentication data so solicited, can be employed, individually and/or in conjunction with information acquired and ascertained as a result of biometric modalities employed, to facilitate control access to the memory. The authentication data can be in the form of a password (e.g., a sequence of humanly cognizable characters), a pass phrase (e.g., a sequence of alphanumeric characters that can be similar to a typical password but is conventionally of greater length and contains non-humanly cognizable characters in addition to humanly cognizable characters), a pass code (e.g., Personal Identification Number (PIN)), and the like, for example. Additionally and/or alternatively, public key infrastructure (PKI) data can also be employed by the authentication component. PKI arrangements can provide for trusted third parties to vet, and affirm, entity identity through the use of public keys that typically can be certificates issued by the trusted third parties. Such arrangements can enable entities to be authenticated to each other, and to use information in certificates (e.g., public keys) and private keys, session keys, Traffic Encryption Keys (TEKs), cryptographic-system-specific keys, and/or other keys, to encrypt and decrypt messages communicated between entities.

The authentication component can implement one or more machine-implemented techniques to identify an entity by its unique physical and behavioral characteristics and attributes. Biometric modalities that can be employed can include, for example, face recognition wherein measurements of key points on an entity's face can provide a unique pattern that can be associated with the entity, iris recognition that measures from the outer edge towards the pupil the patterns associated with the colored part of the eye—the iris—to detect unique features associated with an entity's iris, and finger print identification that scans the corrugated ridges of skin that are non-continuous and form a pattern that can provide distinguishing features to identify an entity.

Artificial intelligence based systems (e.g., explicitly and/or implicitly trained classifiers) can be employed in connection with performing inference and/or probabilistic determinations and/or statistical-based determinations as in accordance with one or more aspects of the disclosed subject matter as described herein. As used herein, the term "inference," "infer" or variations in form thereof refers generally to the process of reasoning about or inferring states of the system, environment, and/or user from a set of observations as captured via events and/or data. Inference can be employed to identify a specific context or action, or can generate a probability distribution over states, for example. The inference can be probabilistic—that is, the computation of a probability distribution over states of interest based on a consideration of data and events. Inference can also refer to techniques employed for composing higher-level events from a set of events and/or data. Such inference results in the construction of new events or actions from a set of observed events and/or stored event data, whether or not the events are correlated in close temporal proximity, and whether the events and data come from one or several event and data sources. Various classification schemes and/or systems (e.g., support vector machines, neural networks, expert systems, Bayesian belief networks, fuzzy logic, data fusion engines . . . ) can be employed in connection with performing automatic and/or inferred action in connection with the disclosed subject matter.

For example, an artificial intelligence based system can evaluate current or historical evidence associated with programming operations executed or being executed on a memory device (e.g., memory component 102), and based in part in such evaluation, can render an inference, based in part on probability, regarding, for instance, a source BL voltage level that can be supplied to a memory cell during an operation (e.g., programming, reading, erasing, verifying) associated with the memory cell, a drain BL voltage level that can be supplied to a memory cell during an operation, a WL voltage level that can be supplied to a memory cell during an operation, etc.

As utilized herein, terms "component," "system," "interface," and the like, can refer to a computer-related entity, either hardware, software (e.g., in execution), and/or firmware. For example, a component can be a process running on a processor, a processor, an object, an executable, a program, and/or a computer. By way of illustration, both an application running on a server and the server can be a component. One or more components can reside within a process and a component can be localized on one computer and/or distributed between two or more computers.

Furthermore, the disclosed subject matter can be implemented as a method, apparatus, or article of manufacture using standard programming and/or engineering techniques to produce software, firmware, hardware, or any combination thereof, to control a computer to implement the disclosed subject matter. The term "article of manufacture" as used herein is intended to encompass a computer program accessible from any computer-readable device, carrier, or media. For example, computer readable media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Additionally it should be appreciated that a carrier wave can be employed to carry computer-readable electronic data such as those used in transmitting and receiving electronic mail or in accessing a network such as the Internet or a local area network (LAN). Of course, those skilled in the art will recognize many modifications may be made to this configuration without departing from the scope or spirit of the disclosed subject matter.

Some portions of the detailed description have been presented in terms of algorithms and/or symbolic representations of operations on data bits within a computer memory. These algorithmic descriptions and/or representations are the means employed by those cognizant in the art to most effectively convey the substance of their work to others equally skilled. An algorithm is here, generally, conceived to be a self-consistent sequence of acts leading to a desired result. The acts are those requiring physical manipulations of physical quantities. Typically, though not necessarily, these quantities take the form of electrical and/or magnetic signals capable of being stored, transferred, combined, compared, and/or otherwise manipulated.

It has proven convenient at times, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise as apparent from the foregoing discussion, it is appreciated that throughout the disclosed subject matter, discussions utilizing terms such as processing, computing, calculating, determining, and/or displaying, and the like, refer to the action and processes of computer systems, and/or similar consumer and/or industrial electronic devices and/or machines, that manipulate and/or transform data represented as physical (electrical and/or electronic) quantities within the computer's and/or machine's registers and memories into other data similarly represented as physical quantities within the machine and/or computer system memories or registers or other such information storage, transmission and/or display devices.

What has been described above includes examples of the subject innovation. It is, of course, not possible to describe every conceivable combination of components or methodologies for purposes of describing the subject innovation, but one of ordinary skill in the art may recognize that many further combinations and permutations of the subject innovation are possible. Accordingly, the subject innovation is intended to embrace all such alterations, modifications, and variations that fall within the spirit and scope of the appended claims. Furthermore, to the extent that the term "contain," "includes," and "involves" are used in either the detailed description or the claims, such terms are intended to be inclusive in a manner similar to the term "comprising" as "comprising" is interpreted when employed as a transitional word in a claim.

What is claimed is:

1. A system that facilitates performance of operations associated with a memory, comprising:
a memory array associated with the memory that contains a plurality of memory cells wherein at least a portion of the plurality of memory cells are a non-floating gate type of nonvolatile memory cell; and
an optimized voltage component that supplies a predetermined source bitline voltage to a source bitline associated with at least one memory cell of the plurality of memory cells during a programming portion of a program operation performed on the at least one memory cell, wherein an amount of the predetermined source bitline voltage is determined based at least in part on an amount of a predetermined drain bitline voltage supplied to a drain bitline associated with the at least one memory cell during the programming portion of the program operation, and wherein the at least one memory cell is a non-floating gate type of nonvolatile memory cell.

2. The system of claim 1, the predetermined source bitline voltage is a positive voltage bias that is greater than zero volts.

3. The system of claim 2, the predetermined source bitline voltage is greater than 0.5 volts.

4. The system of claim 1, the optimized voltage component supplies a predetermined drain bitline voltage to a drain bitline associated with the at least one memory cell and a predetermined wordline voltage to a wordline associated with the at least one memory cell.

5. The system of claim 4, the amount of the predetermined source bitline voltage to be supplied to the source is determined based at least in part on at least one of the predetermined drain bitline voltage or the predetermined wordline voltage.

6. The system of claim 1, the predetermined source bitline voltage is determined based at least in part on at least one of characteristics associated with the plurality of memory cells or a type of the plurality of memory cells.

7. The system of claim 1, each of the plurality of memory cells are a non-floating gate type of nonvolatile memory cell.

8. The system of claim 7, the plurality of memory cells are formed of an oxide layer, a silicon rich nitride layer, a polysilicon layer, another silicon rich nitride layer, and another oxide layer, wherein charge is stored in the polysilicon and silicon rich nitride layers to facilitate data storage.

9. The system of claim 1, at least a portion of the plurality of memory cells are a floating gate type of nonvolatile memory cell.

10. The system of claim 1, further comprising:
a host processor that generates commands to facilitate the performance of the operations in the memory, the host processor is associated with the memory; and
a presentation component that facilitates displaying data read from the memory and received data input.

11. The system of claim 1, the plurality of memory cells are nonvolatile memory cells.

12. An electronic device comprising the system of claim 1.

13. The electronic device of claim 12, the electronic device is at least one of a computer, a cellular phone, a digital phone, a video device, a smart card, a personal digital assistant, a television, an electronic game, a digital camera, an electronic organizer, an audio player, an audio recorder, an electronic device associated with digital rights management, a Personal Computer Memory Card International Association (PCMCIA) card, a trusted platform module (TPM), an electronic control unit associated with a motor vehicle, a global positioning satellite (GPS) device, an electronic device associated with an airplane, an electronic device associated with an industrial control system, a Hardware Security Module (USM), a set-top box, a secure memory device with computational capabilities, or an electronic device with at least one tamper-resistant chip.

14. A method that facilitates programming associated with a memory, comprising:
supplying a predetermined source voltage to a source bitline associated with at least one memory cell in the memory during a programming portion of a program operation performed on the at least one memory cell, wherein an amount of the predetermined source voltage is determined based at least in part on an amount of a predetermined drain voltage supplied to a drain bitline associated with the at least one memory cell during the programming portion of the program operation, and wherein the at least one memory cell is a non-floating gate type of nonvolatile memory cell; and
programming data to the at least one memory cell based at least in part on at least one of the predetermined source voltage or the predetermined drain voltage.

15. The method of claim 14, further comprising:
generating at least one command;
supplying the predetermined source voltage to the at least one memory cell based at least in part on the at least one command; and
supplying a predetermined drain voltage to the at least one memory cell based at least in part on the at least one command.

16. The method of claim 15, further comprising:
supplying a predetermined gate voltage to the at least one memory cell based at least in part on the at least one command;
programming data to the at least one memory cell, the at least one command is associated with a program operation; and
removing at least one of the predetermined source voltage, predetermined drain voltage, or the predetermined gate voltage.

17. The method of claim 16, the programming data to the at least one memory cell further comprising programming based at least in part on channel hot electron injection to facilitate programming the data.

18. The method of claim 14, the supplying a predetermined source voltage to at least one memory cell in the memory, further comprising supplying a positive source voltage to the at least one memory cell.

19. The method of claim 14, the supplying a predetermined source voltage to at least one memory cell in the memory, further comprising supplying a positive source voltage of at least 0.5 volts to the at least one memory cell.

20. The method of claim 14, the predetermined source voltage is based at least in part on at least one of the predetermined drain voltage or the predetermined gate voltage.

* * * * *